(12) United States Patent
Lee et al.

(10) Patent No.: US 9,847,507 B2
(45) Date of Patent: Dec. 19, 2017

(54) DISPLAY APPARATUS AND MANUFACTURING METHOD THEREOF

(71) Applicant: Samsung Display Co., Ltd., Yongin-si, Gyeonggi-do (KR)

(72) Inventors: Hong Ro Lee, Yongin-si (KR); Chung Hwan Lee, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/249,057

(22) Filed: Aug. 26, 2016

(65) Prior Publication Data

US 2017/0110685 A1     Apr. 20, 2017

(30) Foreign Application Priority Data

Oct. 15, 2015 (KR) .......................... 10-2015-0144062

(51) Int. Cl.
| | |
|---|---|
| *H01L 51/52* | (2006.01) |
| *H01L 27/32* | (2006.01) |
| *H01L 51/00* | (2006.01) |
| *H01L 27/12* | (2006.01) |
| *H01L 29/786* | (2006.01) |

(52) U.S. Cl.
CPC ...... *H01L 51/5253* (2013.01); *H01L 27/3262* (2013.01); *H01L 51/0096* (2013.01); *H01L 51/529* (2013.01); *H01L 27/1222* (2013.01); *H01L 27/1274* (2013.01); *H01L 29/78675* (2013.01)

(58) Field of Classification Search
CPC .................. H01L 51/5253; H01L 27/3262
See application file for complete search history.

(56) References Cited

U.S. PATENT DOCUMENTS

| | | | | |
|---|---|---|---|---|
| 6,940,722 | B2* | 9/2005 | Tetsuka | H01L 23/427 257/E23.088 |
| 9,391,293 | B2* | 7/2016 | Cho | C09J 11/00 |
| 9,437,831 | B2* | 9/2016 | Yamazaki | H01L 27/1225 |
| 9,581,844 | B2* | 2/2017 | Kim | G02F 1/133305 |
| 9,583,740 | B2* | 2/2017 | Farrnbacher | H01L 24/72 |
| 2014/0240926 | A1* | 8/2014 | Choi | H04M 1/0266 361/707 |

FOREIGN PATENT DOCUMENTS

| | | |
|---|---|---|
| KR | 10-1391774 | 5/2014 |
| KR | 10-2014-0084919 | 7/2014 |
| KR | 10-1481826 | 1/2015 |
| KR | 10-2015-0060015 | 6/2015 |
| KR | 10-2015-0061405 | 6/2015 |

* cited by examiner

*Primary Examiner* — William Coleman
(74) *Attorney, Agent, or Firm* — Knobbe Martens Olson & Bear, LLP

(57) ABSTRACT

A display panel includes: a substrate including a first substrate layer which includes a glass material and a second substrate layer contacting the first substrate layer and which includes a polymer material; a thin film transistor disposed on the substrate; and a light emitting element disposed on the thin film transistor.

17 Claims, 7 Drawing Sheets

DISPLAY APPARATUS AND MANUFACTURING METHOD THEREOF

CROSS-REFERENCE TO RELATED APPLICATION

This application claims priority to, and the benefit of, Korean Patent Application No. 10-2015-0144062, filed in the Korean Intellectual Property Office on Oct. 15, 2015, the entire contents of which are incorporated herein by reference.

BACKGROUND

Field

The present disclosure relates to a display panel and a manufacturing method thereof.

Description of the Related Technology

Starting with the development of smart phones, there has been an increasing demand for display devices used in small-sized electronic devices. In addition to smart phones, display devices have been widely used not only in smart electronic devices such as a tablet PC, a smart watch, and the like, but also in electronic devices used in everyday life such as, for example, vehicle navigation devices equipped with a touch screen.

As the demand for display devices has increased, the thickness of the display devices has become slimmer in order to reduce weight and volume for convenient portability and mobility. However, as the display devices become thinner, various problems may occur, such as a breaking or product failure.

The above information disclosed in this Background section is only to enhance the understanding of the background of the invention, and therefore it may contain information that does not form the prior art that is already known in this country to a person of ordinary skill in the art.

SUMMARY OF CERTAIN INVENTIVE ASPECTS

The present disclosure has been made in an effort to provide a display panel that can prevent breakage and product failure, and a method for manufacturing the same.

Further, the technical object to be achieved by the present disclosure is not limited to the aforementioned technical objects, and other unmentioned technical objects will be understood by those skilled in the art from the description below A display panel according to one embodiment includes: a substrate including a first substrate layer comprising a glass material and a second substrate layer contacting the first substrate layer and comprising a polymer material; a thin film transistor disposed on the substrate; and a light emitting element disposed on the thin film transistor.

The display panel may further include a buffer layer disposed between the second substrate layer and the thin film transistor.

A thermal transfer coefficient of the second substrate layer may be smaller than a thermal transfer coefficient of the buffer layer, and the thermal transfer coefficient of the second substrate layer may be about 0.5 W/m·K or less.

The buffer layer may comprise an inorganic material.

An area of the second substrate layer may be smaller than an area of the first substrate layer, and edges of the second substrate layer may be surrounded by edges of the first substrate layer.

A gap between the edges of the first substrate layer and the edges of the second substrate layer may be between about 20 μm and about 100 μm.

The thickness of the first substrate layer may be between about 0.2 μm and about 0.4 mm, and the thickness of the second substrate layer may be between about 1 μm and about 100 μm.

A method for manufacturing a display panel according to an embodiment includes: forming a second substrate layer comprising a polymer material on one side of a first substrate layer comprising a glass material; forming a thin film transistor on the second substrate layer; and forming a light emitting element on the thin film transistor.

The thin film transistor may include a semiconductor layer including amorphous silicon, and the method for manufacturing the display panel may further include crystallizing the amorphous silicon to polycrystalline silicon.

The crystallization may be a low temperature polycrystalline silicon (LTPS) process.

Providing the first substrate layer as a mother substrate, the area of which corresponds to the size of a plurality of unit display panels; and forming the second substrate layer corresponding to the size of each unit display panel on the mother substrate.

The method for manufacturing the display panel may further include cutting the first substrate layer to make the area of the first substrate layer greater than the area of the second substrate layer and aligning the edges of the second substrate layer to be surrounded by the edges of the first substrate layer.

A gap between the edges of the first substrate layer and the edges of the second substrate layer may be between about 20 μm and about 100 μm.

The method for manufacturing the display panel may further include forming a buffer layer between the second substrate layer and the thin film transistor.

A thermal transfer coefficient of the second substrate layer may be smaller than a thermal transfer coefficient of the buffer layer, and the thermal transfer coefficient of the second substrate layer may be about 0.5 W/m·K or less.

The buffer layer may comprise an inorganic material.

The first substrate layer may include a first surface contacting the second substrate layer and a second surface disposed on the opposite side of the first substrate, and the method for manufacturing the display panel may further include etching the second surface of the first substrate layer.

Etching the second surface of the first substrate layer may include making the thickness of the first substrate layer between about 0.2 mm and about 0.4 mm.

The thickness of the second substrate layer coated on one side of the first substrate layer and then cured may be between about 1 μm and about 100 μm.

DETAILED DESCRIPTION OF CERTAIN INVENTIVE EMBODIMENTS

Figure 1:
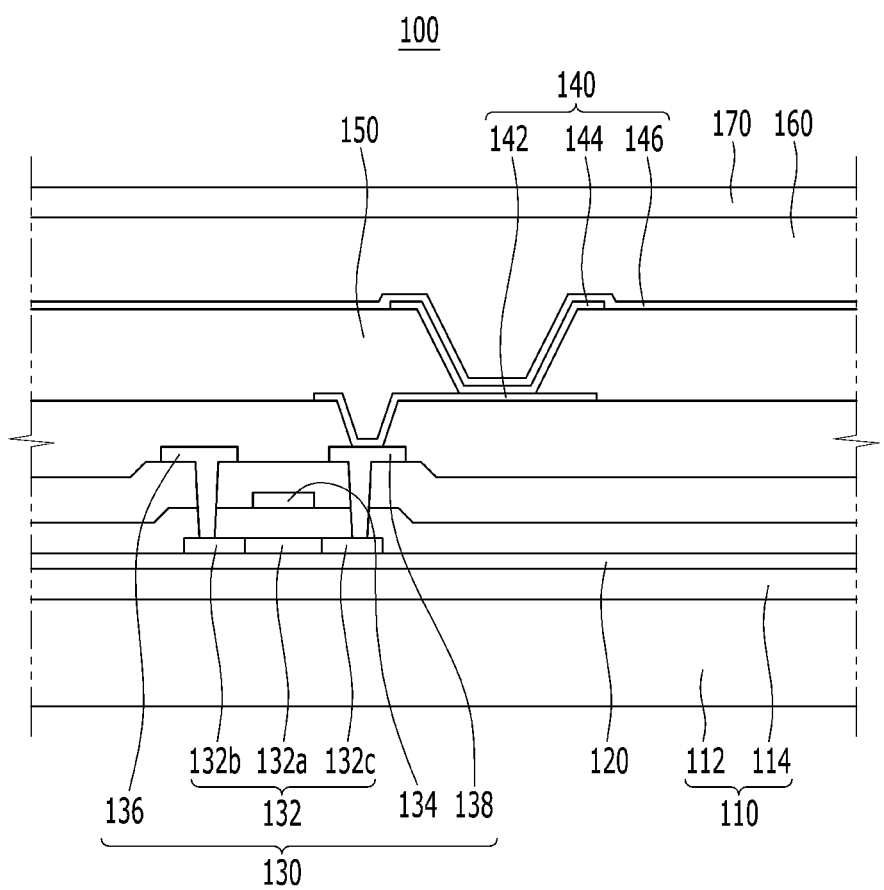
FIG. 1 is a cross-sectional view of one pixel of a display panel according to one embodiment.

Hereinafter, certain embodiments will be described in detail with reference to the accompanying drawings. However, in describing the embodiments, descriptions of already known functions or configurations will be omitted so as to make the disclosure more clear.

The drawings and description are to be regarded as illustrative in nature and not restrictive. Like reference numerals generally designate like elements throughout the specification. In addition, the size and thickness of each configuration shown in the drawings are arbitrarily shown for better understanding and ease of description, but the present invention is not limited thereto.

In the drawings, the thickness of layers, films, panels, regions, etc., may be exaggerated for clarity. In the drawings, for better understanding and ease of description, the thicknesses of some layers and areas may be exaggerated. It will be understood that when an element such as a layer, film, region, or substrate is referred to as being "on" another element, it can be directly on the other element or intervening elements may also be present.

Figure 2:
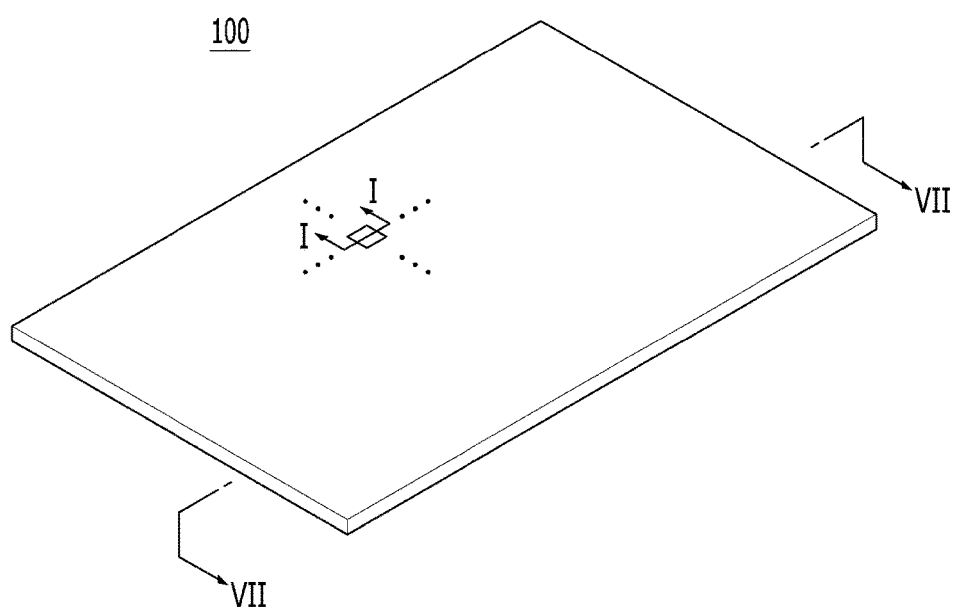
FIG. 2 is a perspective view of the display panel having the cross-section of FIG. 1.

FIG. 1 illustrates a cross-sectional view of a display panel 100 according to one embodiment, and FIG. 2 illustrates the display panel 100 having the cross-section of FIG. 1.

As shown in FIG. 1, the display panel 100 includes a substrate 110, a thin film transistor 130, and a light emitting element 140.

The substrate 110 is formed of a double-layered structure including a first substrate layer 112 and a second substrate layer 114. In some embodiments, the first substrate layer 112 and the second substrate layer 114 have different physical properties.

More specifically, the first substrate layer 112 may include a glass material, and the second substrate layer 114 disposed on the first substrate layer 112 may include a polymer layer. When the substrate 110 is made much thinner, it may be easily damaged by an external impact because the first substrate layer 112 is made of a glass material having rigid and brittle characteristics. Thus, the second substrate layer 114 having a relatively ductile characteristic compared to the first substrate layer 112 and made of a polymer material is provided to prevent damage to the first substrate layer 112.

A thin film transistor 130 may be disposed on the substrate 110. The thin film transistor 130 may have a multi-layered structure including a semiconductor layer 132, which includes a channel area 132a, a source area 132b, and a drain area 132c, a gate electrode 134, a source electrode 136, and a drain electrode 138. The semiconductor layer 132, the gate electrode 134, the source electrode 136, and the drain electrode 138 are respectively disposed on different layers. The source electrode 136 and the drain electrode 138 may be disposed on the same layer. As shown in FIG. 1, the source electrode 136 and the drain electrode 138 may electrically contact the source area 132b and the drain area 132c of the semiconductor layer 132, respectively, through contact holes.

In this case, the semiconductor layer 132 may include a material including silicon. The silicon material forming the semiconductor layer 132 may be first deposited as amorphous silicon and then may be crystallized as poly-crystal silicon by an energy source such as laser and the like.

During the crystallization process, energy applied to the semiconductor layer 132 should be sufficiently used in growing crystal without being leaked to the outside. When crystals cannot be sufficiently grown to form poly-crystal silicon from amorphous silicon, stains may be generated in the semiconductor layer 132, thereby causing failure of the semiconductor layer 132.

In some embodiments, when the second substrate layer 114 is further included, the second substrate layer 114 prevents energy applied to the semiconductor layer 132 from being discharged to the outside and helps sufficient growth of the crystals by delaying the cooling speed of the semiconductor layer 132.

Figure 3:
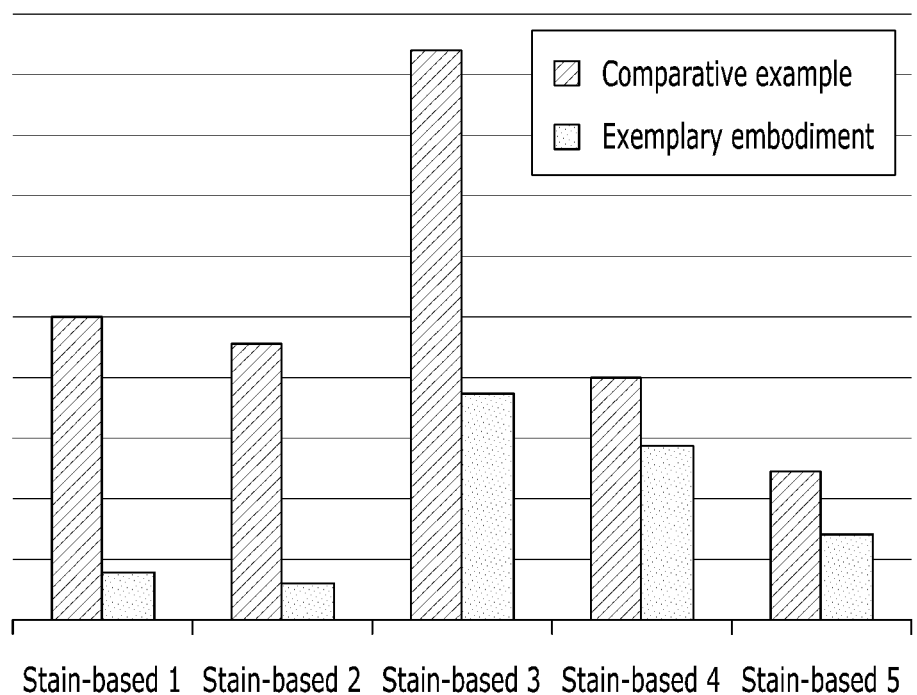
FIG. 3 is a graph illustrating a stain failure rate of a semiconductor layer depending on the existence of a second substrate layer.

FIG. 3 is a graph illustrating an inferiority rate caused by stains of the semiconductor layer 132 depending on the existence of the second substrate layer 114. A second substrate layer 114 used in an experiment is a polymer including a polyimide material, and has a thickness of about 20 µm. The horizontal axis of FIG. 3 sequentially denotes prepared numbers of five samples, each provided with the second substrate layer 114 and five samples, each not provided with the second substrate layer 114, and the heights of graphs in the vertical axis respectively denote the degree of generation of stains in the semiconductor layer 132, which were experienced in the crystallization process. When the height of vertical axis graph is high, many more stains are observed to have been generated.

As shown in FIG. 3, inferiority rates due to stains generated in the semiconductor layer 132 are significantly distinguished from each other depending on whether the second substrate layer 114 is provided or not. When the second substrate layer 114 is provided, an inferiority rate due to stains of the semiconductor layer 132 is significantly high compared to the case in which the second substrate layer 114 is not provided.

Referring back to FIG. 1, the display panel 100 according to an embodiment further includes a buffer layer 120 provided between second substrate layer 114 and the thin film transistor 130. The buffer layer 120 may include an inorganic material such as, for example, $SiN_x$, $SiO_2$, and the like. The buffer layer 120 is provided between the substrate 110 and the thin film transistor 130 to prevent contamination from penetrating the substrate 110, thereby preventing interference of the driving of the display panel 100 of the thin film transistor 130, and like the second substrate layer 114, the buffer layer 120 may serve as an insulation layer to help sufficient growth of crystals of the semiconductor layer 132.

The second substrate layer 114 may include a material having a smaller heat transfer coefficient that that of the buffer layer 120. Table 1 shows heat transfer coefficients of SiNx and $SiO_2$, which are representative example inorganic materials forming the buffer layer 120 and various polymer materials. As shown in Table 1, the second substrate layer 114 may include a polymer material having a heat transfer coefficient of 0.5 W/m·K or less. Thus, any material having a heat transfer coefficient of 0.5 W/m·K other than the polymer materials shown in Table 1 may be used in other embodiments.

TABLE 1

| Material | Heat transfer coefficient (unit: W/m · K) |
| --- | --- |
| Polyester | 0.15-0.4 |
| Polyvinyl | 0.14-0.17 |
| Polycarbonate | 0.19 |
| Polyethylene | 0.23 |
| Polyacetate | 0.17 |
| Polypropylene | 0.14 |
| Polystyrene | 0.10-0.14 |
| Polyimide | 0.35 |
| Polyethersulphone (PES) | 0.26 |
| $SiO_2$ | 1.5 |
| $SiN_x$ | 30 |

Figure 4:
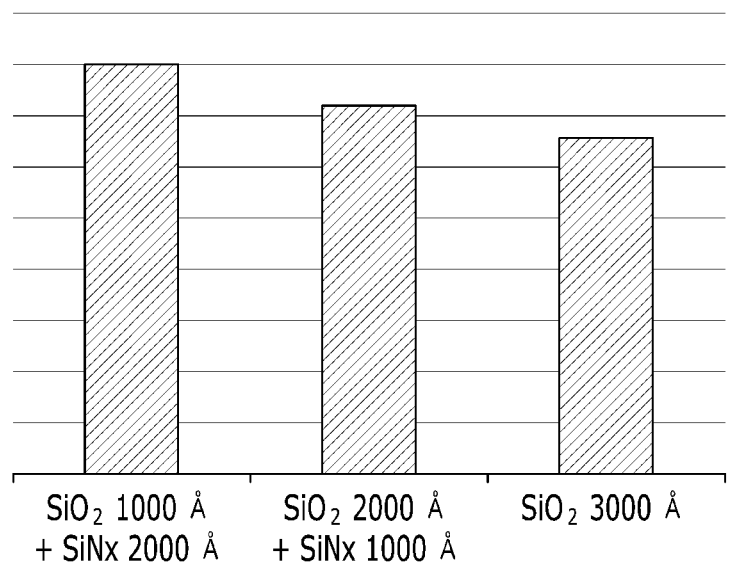
FIG. 4 is a graph illustrating a stain failure rate of the semiconductor layer according to the thickness of a material forming a buffer layer.

FIG. 4 is a graph that illustrates stain-caused inferiority rates of the semiconductor layer 132 according to thickness differences of materials forming the buffer layer 120. In FIG. 4, the horizontal axis denotes samples according to thicknesses of SiNx and $SiO_2$ and the vertical axis denotes degrees of generations of stains in the semiconductor 132 after a crystallization process. When the height of the vertical axis graph is high, many more stains are generated.

As shown in FIG. 4, as the thickness of $SiN_x$ having a high heat transfer coefficient is increased, many more stains are generated in the semiconductor layer 132, and when the thickness of $SiN_x$ having a low heat transfer coefficient is increased, much less stains are generated in the semiconductor layer 132.

Thus, when the heat transfer coefficient of the second substrate layer 114 is low, much less stains are generated in the semiconductor layer 132.

The thickness of the first substrate layer 112 may be about 0.2 mm to about 0.4 mm, and the thickness of the second substrate layer 114 may be about 1 mm to 100 μm. The thickness of the second substrate layer 114 is measured after the polymer layer is coated and cured. When the second substrate layer 114 has a thickness of less than about 1 μm, the first substrate layer 112 is coated by coating the polymer layer and a solvent is volatilized. However, the thickness of the first substrate layer 112 may be significantly non-uniform during the solvent volatilization process and thus stains cannot be sufficiently reduced in a crystallization process of the semiconductor layer 132. Further, when the thickness of the second substrate layer 114 exceeds about 100 μm, the amount of solvent to be volatilized is too much, thereby causing deterioration of economic efficiency, and even after volatilization of the solvent, the first substrate 112 may be bent due to the weight of the polymer layer.

Figure 5:
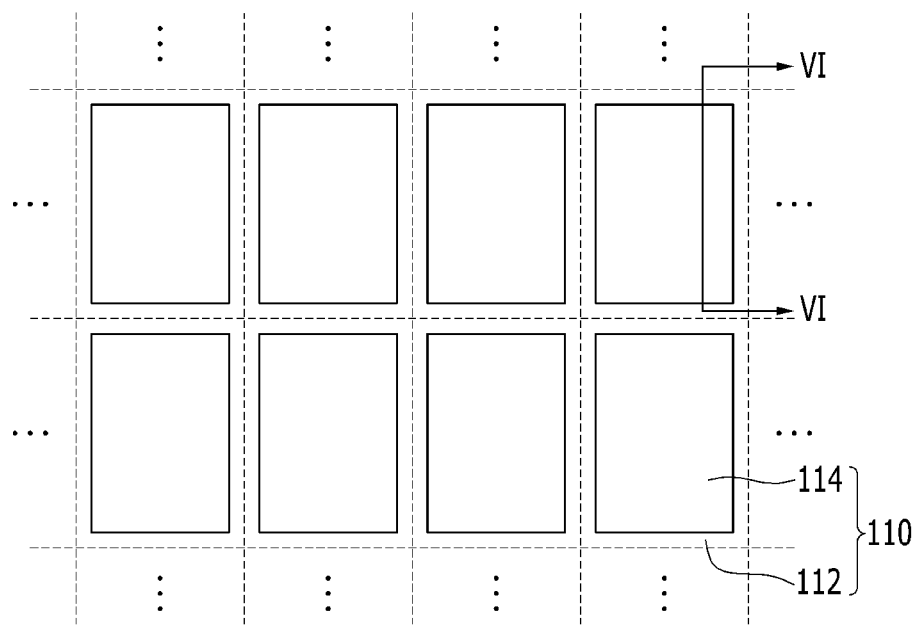
FIG. 5 illustrates cutting lines of a first substrate layer where the second substrate layer is formed according to an embodiment.
Figure 6:
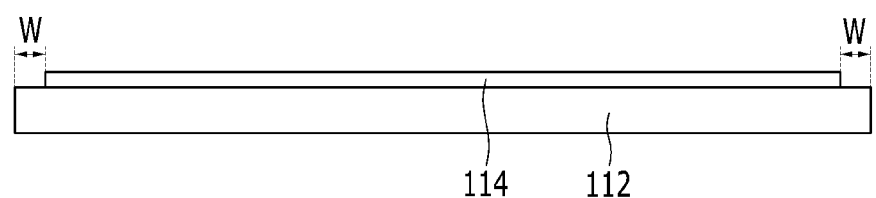
FIG. 6 illustrates a cross-section of the first substrate layer where the second substrate layer is formed in FIG. 5.

In FIG. 5, cutting lines along which the second substrate layer 114 and the first substrate 112 are formed corresponding to the size of the display panel 100 on the first substrate 112, which is provided as a mother substrate, are cut are illustrated. FIG. 6 illustrates a cross-sectional view of the substrate 110 cut along the cutting lines of FIG. 5.

As shown in FIG. 5, the first substrate layer 112 may be provided as a mother substrate, the area of which corresponds to a plurality of unit display panels. The second substrate layer 114 is provided corresponding to the unit display panel in size on the first substrate layer 112, which is the mother substrate. Thus, the area of the second substrate layer 114 is smaller than the area of the first substrate layer 112.

Even after the first substrate layer 112 is cut, the area of the second substrate layer 114 is smaller than the area of the first substrate layer 112, as shown in FIG. 6. The edges of the cut first substrate layer 112 are the same as the edges cut along the cutting line VII-VII of FIG. 5. Thus, as shown in FIG. 5, the edges of the second substrate layer 114 may be surrounded by the edges of the first substrate layer 112.

In order to cut the first substrate layer 112, cracks are generated in the first substrate layer 112 and then stress is applied to the first substrate layer 112 such that the cracks naturally spread, thereby cutting the first substrate layer 112. In this case, when the second substrate layer 114 including a polymer material is formed, the natural spread of the cracks is blocked so that cutting of the first substrate layer 112 may be interrupted.

Further, a cutting method using layers may be used to cut the first substrate layer 112. In such case, since the first substrate layer 112 and the second substrate layer 114 are respectively made of different materials, a failure may occur when areas of the first substrate layer 112 where the second substrate layer 114 is formed are cut. Thus, as shown in FIG. 5, the first substrate layer 112 is prepared as a mother substrate, the second substrate layers 114 are provided corresponding to the size of the display panel 100, which will be completed by each unit, and then the first substrate layer 112 can be cut along the virtual cutting lines. When the first substrate layer 112 is cut as shown in FIG. 5, product failure rate can be further reduced.

As shown in FIG. 6, the second substrate layers 114 are distanced by a gap W from the edges of the first substrate layer 112 that form the edges of the display panel 100.

In this case, the gap W between the edge of the first substrate layer 112 and the edge of the second substrate 114 may be between about 20 μm and about 100 μm. When the gap W between the edge of the first substrate layer 112 and the edge of the second substrate layer 114 is less than about 20 μm, the first surface layer 112 may not be smoothly cut during the cutting process, thereby causing product failure, and when the gap W exceeds about 100 μm, the second substrate layer 114 may not sufficiently perform its role in the crystallization process of the semiconductor layer 132 of the thin film transistor 130 provided at the periphery of the first substrate layer 132.

As shown in FIG. 1, the display panel 100 includes a light emitting element layer 140 provided on the thin film transistor 130, and thus is driven by the thin film transistor 130. The light emitting element layer 140 includes a pixel electrode 142, an organic emission layer 144, and a common electrode 146. The display panel 100 may further include pixel defining layers 150 that open portions corresponding to respective pixels of the display panel 100.

The pixel electrode 142 is provided in an opened area between the pixel defining layers 150, and is electrically connected with a drain electrode 138 of thin film transistor 130. The organic emission layer 144 is provided on the pixel electrode 142 and the common electrode 146 is provided on the organic emission layer 144 such that holes and electrons generated from the pixel electrode 142 and the common electrode 146 meet in the organic emission layer 144 to generate excitons, and then an image may be displayed in the display panel 100 using light discharged when activity of the excitons is being lost.

Figure 7:
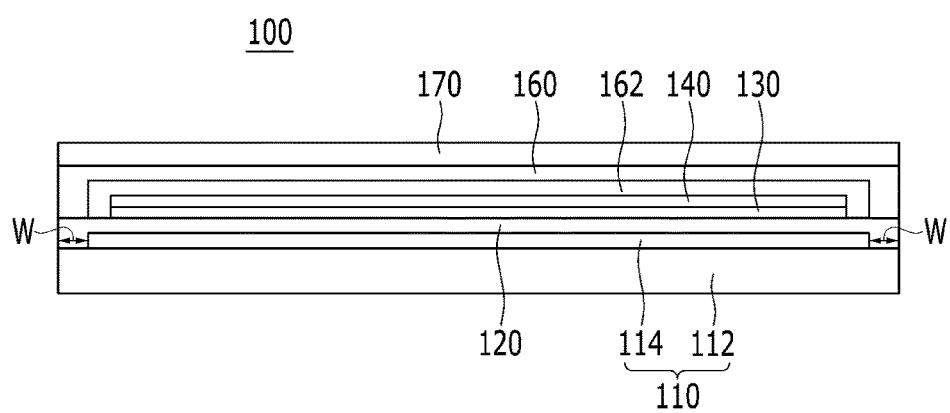
FIG. 7 is a cross-sectional view of the display panel of FIG. 2.

FIG. 7 illustrates a cross-sectional view of the display panel 100 cut along the cutting line VII-VII of FIG. 2. As shown in FIG. 1, the display panel 100 of FIG. 7 includes not only the substrate 110, the thin film transistor 130, and the light emitting element layer 140, but also a passivation layer 162 for protecting the light emitting element layer 140 and an encapsulation member 170, such as a thin film encapsulation layer that is attached to the passivation layer 162 by an adhesive layer 160 provided on the passivation layer 162.

Figure 8:
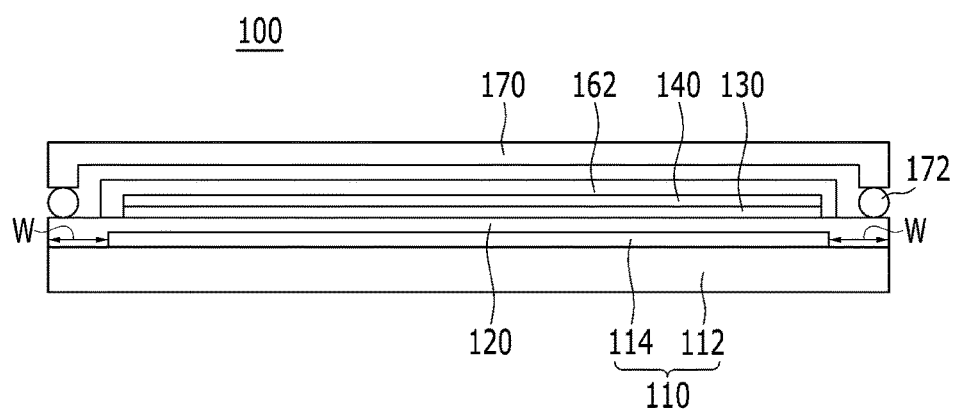
FIG. 8 is a cross-sectional view of a display panel according to an example variation.

Further, FIG. 8 illustrates a display panel 100 including an encapsulation member 170, such as encapsulation glass that is attached by a sealant 172 provided at the edge of the substrate 110, instead of the thin film encapsulation layer according to an exemplary variation.

It can be observed in FIG. 7 and FIG. 8, that the edges of the second substrate layer 114 are disposed further inward in the display panel 100 than the edges of the first substrate layer 112, while having a constant gap W with the edges of the first substrate layer 112.

An embodiment of the display panel 100 has been described. According to this embodiment, the display panel 100 can be prevented from being damaged or becoming defective. Hereinafter, a method for manufacturing a display panel 100 according to another embodiment will be described.

Figure 9:
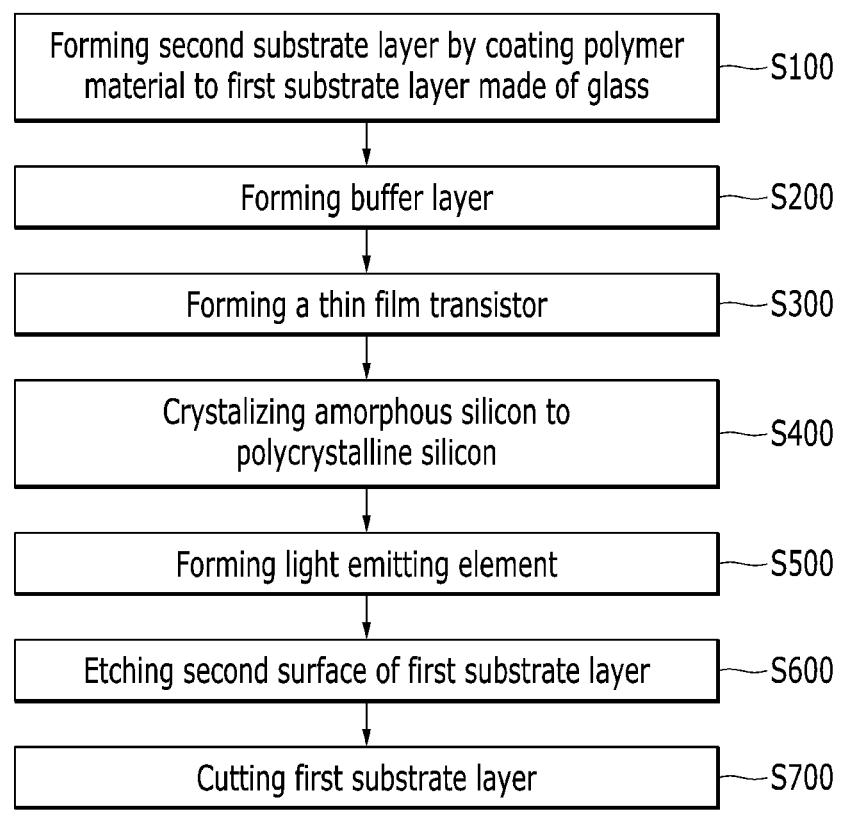
FIG. 9 is a flowchart sequentially illustrating a manufacturing method of a display panel according to another embodiment.

FIG. 9 illustrates a flowchart of a method for manufacturing a display panel 100 according to another embodiment. As shown in FIG. 9, a method for manufacturing a display panel 100 includes forming a second substrate layer 114 by coating a polymer material on one side of a first substrate layer 112 made of a glass material (S100), forming a thin film transistor 130 on the second substrate layer 114 (S300), and forming a light emitting element layer 140 on the thin film transistor 130 (S500).

The forming (S300) of the second substrate 114 by coating the polymer material on one side of the first substrate layer 112 made of a glass material includes forming the second substrate layer 114 by coating the polymer material on the first substrate layer 112, which is a mother substrate 110 as shown in FIG. 5, and then curing the polymer material.

In this case, the second substrate layer 114 may be formed with a shape that corresponds to the shape in the cutting line shown in FIG. 5 so as to make the area or the first substrate layer 112 greater than the area of the second substrate layer 114 and the edges of the second substrate layer 114 surrounded by the edges of the first substrate layer 112.

After forming the second substrate layer 114, forming (S200) a buffer layer 120 may be performed prior to the forming the thin film transistor 130. The buffer layer 120 is an inorganic layer provided on the second substrate layer 114 to prevent permeation of foreign substances to the thin film transistor 130 from the substrate 110.

After the buffer layer 120 is formed, the forming (S300) of the thin film transistor 130 including semiconductor 132 is performed, and the thin film transistor 130 is provided on the buffer layer 120.

In one embodiment, the semiconductor layer 132 may be made of amorphous silicon, and may be divided into a channel area 132a, a source area 132b, and a drain area 132c. The thin film transistor 130 includes a gate electrode 134, a source electrode 136, and a drain electrode 138, and the source electrode 136 and the drain electrode 138 are respectively electrically connected with the source area 132b and the drain area 132c.

Next, crystallizing (S400) of amorphous silicon, used to form the semiconductor layer 132, to polycrystalline silicon may be performed. In order to crystallize amorphous silicon to polycrystalline silicon, very high energy needs to be transmitted to the amorphous silicon using equipment such as, for example, laser. The crystallization of amorphous silicon to polycrystalline silicon may be a low temperature polycrystalline silicon (LTPS) process.

The polymer material forming the second substrate layer 114 may have a lower thermal transfer coefficient than the buffer layer 120, and in order to include various examples shown in Table 1, the thermal transfer coefficient of the second substrate layer 114 is about 0.5 W/m·K or less. The cooling speed of the semiconductor layer 132 may be reduced by the second substrate layer 114 having a relatively low thermal transfer coefficient, and accordingly, amorphous silicon forming the semiconductor layer 132 can be grown to polycrystalline silicon through a sufficient amount of crystallization time.

The thickness of the second substrate layer 114 formed in the first substrate layer 112 may be about 1 μm to about 100 μm. Such a thickness is measured after the second substrate layer 114 made of the polymer material is coated on the first substrate layer 112 and then cured.

When the thickness of the second substrate layer 114 is less than about 1 μm, the first substrate layer 112 is coated by coating a polymer layer, and the thickness of the second substrate layer 114 becomes more significantly non-uniform during a process for volatilization of a solvent in the coated polymer layer so that generation of stains during a crystallization process of the semiconductor layer 132 cannot be sufficiently reduced. Further, when the thickness of the second substrate layer 114 exceeds about 100 μm, the amount of solvent to be volatilized is too much, thereby lowering the economic efficiency, and even after the solvent is volatilized, the first substrate layer 112 may be bent due to the weight of the polymer layer.

Next, forming (S500) of an light emitting element 140 may be performed. In one embodiment, the forming of the light emitting element 140 is performed after the crystallization (S400) is performed, but this is not limited thereto. The manufacturing order can be modified depending on a manufacturing environment, and the scope of the present invention is not limited by the manufacturing procedure of each process.

The forming (S500) of the light emitting element 140 includes forming a pixel electrode 142, forming the organic emission layer 144, and forming a common electrode 146.

In the forming of the pixel electrode 142, pixel defining layers 150 that open pixel areas respectively corresponding to pixels of the display panel 100 are formed on the thin film transistor 130 and then forming the pixel electrode 142 electrically connected to the drain electrode 138 of the thin film transistor 130.

In the forming of the organic emission layer 144, the organic emission layer 144 contacting the pixel electrode 142 is formed in the opened pixel area. Next, the forming of the common electrode 146 that wholly covers the organic emission layer 144 and the pixel defining layer 150 is formed.

Next, as shown in FIG. 7 and FIG. 8, a passivation layer 162 may be further formed and then an encapsulation member 170 may be further formed, but a description thereof will be omitted in this specification.

The first substrate layer 112 includes a first surface that contacts the second substrate layer 114 and a second surface that is disposed on the opposite side of the first surface. The method for manufacturing the display panel 100 may further include etching (S600) the second surface of the first substrate layer 112. The etching of the second surface of the first substrate layer 112 may be performed to make the thickness of the first substrate layer 112 included within a range from about 0.2 to about 0.4 mm. Through such a process, a thin display panel 100 can be provided.

Next, cutting (S700) the first substrate layer 112 is performed. According to one embodiment, as shown in FIG. 5, the first substrate layer 112 is cut along virtual cutting lines formed in gaps between the second substrate layers 114 respectively formed in a size corresponding to the display panel 100 on the first substrate layer 112, which is a mother substrate. After the first substrate layer 112 is cut, as shown in FIG. 5 to FIG. 8, the area of the first substrate layer 112 is still greater than the area of the second substrate layer 114, and the edges of the second substrate layer 114 may be surrounded by the edges of the first substrate layer 112.

FIG. 9 illustrates etching (S600) of the second surface of the first substrate layer 112 prior to the cutting (S700) the first substrate layer 112 in FIG. 9, but this is not restrictive, and as previously stated, the scope of the present invention is not limited by the procedure of each process.

Hereinabove, the display panel 100 and the method for manufacturing the display panel 100 have been described. Embodiments of the display panel 100 capable of preventing damage and the generation of product failure, along with the method for manufacturing the display panel 100, are provided.

While this disclosure has been described in connection with certain embodiments, it is to be understood that the invention is not limited to the disclosed embodiments, but, on the contrary, is intended to cover various modifications and equivalent arrangements included within the spirit and scope of the appended claims. Therefore, the variations and modifications should not be individually differentiated from the technical spirit or the viewpoint of the present invention, and it should be appreciated that modified embodiments will be included in the scope of the appended claims of the present invention.

| Description of symbols> | |
|---|---|
| 100: display panel | 110: substrate |
| 112: first substrate layer | 114: second substrate layer |
| 120: buffer layer | 130: thin film transistor |
| 132: semiconductor layer | 132a: channel area |
| 132b: source area | 132c: drain area |
| 134: gate electrode | 136: source electrode |
| 138: drain electrode | 140: light emitting element |
| 142: pixel electrode | 144: organic emission layer |
| 146: common electrode | 150: pixel defining layer |
| 160: adhesive layer | 162: passivation layer |
| 170: encapsulation member | 172: sealant |
| W: gap between edges of first substrate layer and edges of second substrate layer | |

What is claimed is:

1. A display panel comprising:
   a substrate including:
      a first substrate layer comprising a glass material; and
      a second substrate layer contacting the first substrate layer and comprising a polymer material;
   a thin film transistor disposed on the second substrate layer;
   a light emitting element disposed on the thin film transistor; and
   a buffer layer disposed between the second substrate layer and the thin film transistor,
   wherein a thermal transfer coefficient of the second substrate layer is smaller than a thermal transfer coefficient of the buffer layer.

2. The display panel of claim 1, wherein the thermal transfer coefficient of the second substrate layer is about 0.5 W/m·K or less.

3. The display panel of claim 1, wherein the buffer layer comprises an inorganic material.

4. The display panel of claim 1, wherein an area of the second substrate layer is smaller than an area of the first substrate layer, and edges of the second substrate layer are surrounded by edges of the first substrate layer.

5. The display panel of claim 1, wherein the thickness of the first substrate layer is between about 0.2 μm and about 0.4 mm, and the thickness of the second substrate layer is between about 1 μm and about 100 μm.

6. The display panel of claim 4, wherein a gap between the edges of the first substrate layer and the edges of the second substrate layer is between about 20 μm and about 100 μm.

7. A method for manufacturing a display panel, comprising:
   forming a second substrate layer comprising a polymer material on one side of a first substrate layer comprising a glass material;
   forming a thin film transistor on the second substrate layer;
   forming a light emitting element on the thin film transistor; and
   forming a buffer layer between the second substrate layer and the thin film transistor,
   wherein a thermal transfer coefficient of the second substrate layer is smaller than a thermal transfer coefficient of the buffer layer.

8. The method for manufacturing the display panel of claim 7, wherein the thin film transistor comprises a semiconductor layer including amorphous silicon, and wherein the method for manufacturing the display panel further comprises crystallizing the amorphous silicon to polycrystalline silicon.

9. The method for manufacturing the display panel of claim 7, comprising:
   providing the first substrate layer as a mother substrate, the area of which corresponds to the size of a plurality of unit display panels; and
   forming the second substrate layer corresponding to the size of each unit display panel on the mother substrate.

10. The method for manufacturing the display panel of claim 7, wherein the thermal transfer coefficient of the second substrate layer is about 0.5 W/m·K or less.

11. The method for manufacturing the display panel of claim 7, wherein the buffer layer comprises an inorganic material.

12. The method for manufacturing the display panel of claim 7, wherein the first substrate layer comprises a first surface contacting the second substrate layer and a second surface disposed on the opposite side of the first substrate, and
   wherein the method for manufacturing the display panel further comprises etching the second surface of the first substrate layer.

13. The method for manufacturing the display panel of claim 8, wherein the crystallization is a low temperature polycrystalline silicon (LTPS) process.

14. The method for manufacturing the display panel of claim 9, further comprising cutting the first substrate layer to make the area of the first substrate layer greater than the area of the second substrate layer and aligning the edges of the second substrate layer to be surrounded by the edges of the first substrate layer.

15. The method for manufacturing the display panel of claim 14, wherein a gap between the edges of the first substrate layer and the edges of the second substrate layer is between about 20 μm and about 100 μm.

16. The method for manufacturing the display panel of claim 12, wherein etching the second surface of the first substrate layer comprises making the thickness of the first substrate layer between about 0.2 mm and about 0.4 mm.

17. The method for manufacturing the display panel of claim 16, wherein the thickness of the second substrate layer coated on one side of the first substrate layer and then cured is between about 1 μm and about 100μm.

* * * * *